United States Patent

Michael

Patent Number: 6,061,467
Date of Patent: *May 9, 2000

[54] AUTOMATED OPTICAL INSPECTION APPARATUS USING NEAREST NEIGHBOR INTERPOLATION

[75] Inventor: David Michael, Newton, Mass.

[73] Assignee: Cognex Corporation, Natick, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/367,478

[22] Filed: Jan. 3, 1995

Related U.S. Application Data

[63] Continuation-in-part of application No. 08/236,215, May 2, 1994, abandoned.

[51] Int. Cl.[7] ................................................ G06K 9/00
[52] U.S. Cl. .......................... 382/151; 382/174; 382/199; 382/216; 382/263; 382/291; 382/294
[58] Field of Search .................................. 382/289, 291, 382/293, 294, 296, 199, 146, 151, 174, 141, 145, 147, 149, 205, 209, 216, 217, 218, 224; 395/137; 348/87, 94, 95, 126, 133, 134, 129, 130, 606, 583; 356/375

[56] References Cited

U.S. PATENT DOCUMENTS

| | | | |
|---|---|---|---|
| 4,240,750 | 12/1980 | Kurtz et al. | 356/394 |
| 4,347,964 | 9/1982 | Takasugi et al. | 228/4.5 |
| 4,421,410 | 12/1983 | Karasaki | 356/378 |
| 4,439,010 | 3/1984 | Doty | 350/174 |
| 4,441,248 | 4/1984 | Sherman et al. | 29/574 |
| 4,450,579 | 5/1984 | Nakashima et al. | 382/151 |
| 4,691,367 | 9/1987 | Wevelsiep | 382/296 |
| 4,799,175 | 1/1989 | Sano et al. | 364/552 |
| 4,850,028 | 7/1989 | Kawamura et al. | 382/296 |
| 4,855,928 | 8/1989 | Yamanaka | 364/489 |
| 4,941,191 | 7/1990 | Miller et al. | 382/261 |
| 4,972,359 | 11/1990 | Silver et al. | 364/728.05 |
| 4,985,930 | 1/1991 | Takeda et al. | 382/306 |
| 5,054,097 | 10/1991 | Flinios et al. | 382/294 |
| 5,138,180 | 8/1992 | Yamanaka | 250/561 |
| 5,156,319 | 10/1992 | Shibasaka et al. | 228/9 |
| 5,170,062 | 12/1992 | Miyahara | 250/561 |
| 5,225,891 | 7/1993 | Choumei | 356/376 |
| 5,282,254 | 1/1994 | Chiu et al. | 382/132 |
| 5,302,836 | 4/1994 | Siu | 250/572 |
| 5,422,962 | 6/1995 | Yasukawa et al. | 382/295 |
| 5,495,535 | 2/1996 | Smilansky et al. | 382/145 |
| 5,500,906 | 3/1996 | Picard et al. | 382/220 |
| 5,566,876 | 10/1996 | Nishimaki et al. | 228/102 |

Primary Examiner—Amelia Au
Assistant Examiner—Timothy M. Johnson
Attorney, Agent, or Firm—Maureen Stretch; Tracy Calabresi

[57] ABSTRACT

A system to align oriented (unaligned) objects in an image to permit such operations as dimensional gauging or measurements to be performed. Using the angle of rotation of the object in the unaligned image, the system creates a destination image having rows and columns of pixels aligned with a specified axis. The unaligned image is then aligned by finding a first pixel location in a first column in the destination image; locating a first whole pixel location nearest to the first pixel area in the unaligned image; copying the actual pixel value of the first whole pixel location in the unaligned image to the first pixel location in the destination image; locating a next whole pixel location in the unaligned image; copying the actual pixel value of the next whole pixel location to a next pixel location in the destination image until all pixels in a first column of the window have been copied to the first column of the destination image; locating the next column, and continuing until a last column is located. As a column is being aligned into the destination image, it is projected into a one dimensional image, as interpolation proceeds on the next column.

16 Claims, 12 Drawing Sheets

AUTOMATED OPTICAL INSPECTION APPARATUS USING NEAREST NEIGHBOR INTERPOLATION

This application is a continuation-in-part of application Ser. No. 08/236,215 May 2, 1994, now abandoned, entitled: AUTOMATED OPTICAL INSPECTION APPARATUS USING NEAREST NEIGHBOR INTERPOLATION.

BACKGROUND OF THE INVENTION

A. Field of the Invention

This invention relates generally to machine vision methods and apparatus for locating two dimensional objects that are not aligned to a camera.

B. Background

Machine vision systems are typically used to locate and measure objects being fabricated or inspected in some assembly operation. For example, semiconductor devices, such as integrated circuit chips, are electrically connected to leads on a lead frame. This involves placing and connecting a wire to electrically connect a pad residing on a die (semiconductor chip) to a lead in a lead frame.

Machine vision tools for gauging have been used to locate leads on such a device, and report lead width and lead spacing so the bonding devices will work more accurately. Gauging tools, often called caliper tools, are modeled after mechanical calipers. In a typical machine vision caliper operation, a user specifies the desired separation between the caliper "jaws" or the approximate distance between the edge pairs of interest such as integrated circuit leads.

In a typical application, integrated circuit leads may need to be found for alignment of a wire bonder. In a wire bonder, pads on the semiconductor die are connected to leads using a thread-like wire usually made of gold or aluminum. The wire typically follows a straight path from the lead to the pad. In an inspection system, the wire needs to be inspected for deviation from a straight line which represents its ideal location. When viewed from above the plane of the semiconductor dies, the amount of deviation of the wire from a straight line is known as the wire curl. Determining whether or not a wire is present and intact at all is called determining wire presence.

In a wire bonding application, a post-process inspection step, commonly called the third optical inspection, involves locating and inspecting the position and size of all bonds on the device, the wire connections, wire presence, and the wire heights using optical means to insure that a good connection was created by the bond. This is done after wire bonding is complete and before encapsulation of the integrated circuit.

Machine vision systems or image processing systems (systems that capture images, digitize them and use a computer to perform image analysis) are used on wirebonding machines to align devices and guide the machine for correct bonding placement, but have heretofore not been used during the process for inspection purposes. Separate machines are available to perform inspections outside of and after the bonding process, offline but this requires another piece of capital equipment in the production line, and many inspections cannot be done without information that was available while the bonder was operating.

Heretofore, there appeared to be no known methods of automatically determining wire presence or measuring wire curl, either as a post-process automatic inspection or as an online inspection. If the wires were all aligned to the camera, and treated as two-dimensional objects to be dimensionally gauged, a caliper-like vision tool might be considered, but caliper-like vision tools are optimized to work fastest when the objects are perfectly aligned to the camera's vertical or horizontal axis. If the object is not aligned in some cases the measurement cannot be made, or, the measurement is made with low accuracy or with a different procedure or either the object or vision tool must be rotated to align with one another. Two-dimensional objects to-be-measured often can appear in any orientation in front of the camera, rotated at any angle.

Two previous approaches have been used to find ways to apply caliper-like tools to the more generalized problem of the nonaligned two-dimensional object: the first, uses linear interpolation to rotate images to align objects to the camera and the second, uses skewed windows shaped like parallelograms that are aligned to the objects. The drawback of using linear interpolation is speed. It is too slow to meet certain kinds of application needs.

The drawback of using skewed windows for some applications is that the final results of applying a caliper-like vision tool change with the changing angle of the object. That is, the measurement of the same object may be different depending on its orientation. There are a limited number of applications where this change is acceptable.

Finally, in order to locate a wire automatically during the wirebonding assembly process to perform an inspection, the speed of the vision tools used is a critical factor. Wire presence in a wire bonding inspection is presently measured by manual means using a microscope after the die has been bonded. In most applications, the inspection is done on a sampled basis, but for expensive parts, it may be necessary to inspect 100% of the parts being bonded. Manual techniques for this are both costly and time-consuming.

Since wires are specular three dimensional objects, their appearance changes drastically with very small changes in source illumination direction. Wires usually pass above a background of a semiconductor die, a wire bonder heating plate, and a lead frame. Techniques for locating and inspecting the wire with respect to such a confusing background need to be robust as well as fast and are consequently more difficult to develop.

In addition, the optical system of the image processor or machine vision system is usually focused on either the semiconductor die or the lead frame but not the wire, so the wire itself is not in focus. Processing out of focus images is also more difficult.

SUMMARY

The present invention provides a method and apparatus for aligning oriented objects in an image to permit dimensional gauging by locating the oriented object within an image; specifying an angle of rotation of the object; specifying a destination image having the same dimensions as the expected object, but having no angle of rotation. The unaligned image of the oriented object is aligned into the destination image by locating a first pixel area in the unaligned image corresponding to a first pixel location in a first column in the destination image; locating a first whole pixel location nearest to the first pixel area in the unaligned image; copying the actual pixel value of the first whole pixel location in the unaligned image to the first pixel location in the destination image; moving, column by column along the angle of rotation in the window the height of a pixel to a second pixel area; locating a second whole pixel location; copying the actual pixel value of the second whole pixel location in the unaligned image to a second pixel location in the destination image, until all pixels in a first column of the unaligned image have been copied to the first row of the destination image; locating the next column, copying its pixels to the destination image; and continuing until a last column is located. In a preferred embodiment, as a column is being aligned into the destination image, it is also projected into a one dimensional image, as interpolation proceeds on the next column. Upon completion, the image has been aligned and a projection created that permits normal caliper processing to continue.

In a preferred embodiment, wires created in a wirebonding process can be gauged according to the method and apparatus of the present invention by specifying an expected wire angle of an ideal straight wire; specifying a window for searching for an oriented object; specifying an angle of rotation of the window; specifying a destination image having the same dimensions as the expected object but having no angle of rotation; aligning the image; performing a projection on the destination image; and applying a one-dimensional edge filter to create a first derivative. This first derivative is analyzed for a characteristic wire signature having a first edge with correct polarity separated by an appropriate distance from another edge of a different correct polarity; if no wire signature is found, the first derivative is analyzed to locate a characteristic specularity signature having a first edge of a certain polarity separated by an appropriate distance from an second edge of a different correct polarity; if no signature of either type is found a not found signal is returned; if one or more signatures are found, one is selected as the found wire based on evaluation of image intensity, contrast, location within the window, and information about previously found wires. The location of the found signature is subtracted from the expected location of the ideal straight line in a direction perpendicular to the direction of the ideal straight line wire and the subtracted value is returned to the system as a wire curl measurement signal.

It is an object of this invention to locate what are known as rotated, or unaligned oriented objects in an image quickly, measure them and send the presence and measurement signals to another module or system for further action or alignment, such as part rejection or machine adjustment.

It is an aspect of the present invention that it is approximately four times faster than existing gauging tools such as caliper tools using linear interpolation. This performance improvement is achieved with a minimal affect on accuracy and about the same ease of use. Speed of execution, coupled with accuracy permits the present invention to be incorporated in online gauging or bonding systems in situations in which prior methods would not be feasible.

It is another feature of the present invention that it is much more accurate than existing caliper tools employing skewed projection windows, and in addition, is much easier to use.

In yet another aspect of the invention, it works with approximately the same speed no matter what the angle of an object's alignment to the camera may be. Existing caliper tools are fastest at angles aligned with the camera or rotated around such an alignment in 90 degree increments. Existing tools are usually slower since accuracy tends to suffer as the alignment deviates from a 90 degree angle and in some cases, a nonaligned object cannot be measured with existing techniques.

It is still another aspect of the present invention that its accuracy is comparable to traditional caliper tools using linear interpolation. The present invention has a positional error of one twentieth of a pixel compared to calipers using linear interpolation, which do not have positional error. In most applications a pixel error of one twentieth is considered negligible, particularly if the speed is four times faster.

When used in a preferred embodiment coupled with edge filters to locate signatures to find wires bonded by a wirebonding system, the present invention permits wire presence to be detected automatically when this was heretofore not considered possible, because of speed and accuracy limitations of prior methods.

It is also a feature of the present invention that it makes wire curl measurements and reports them to a decision module or host controller, when this too, was heretofore not considered possible in a vision system used in semiconductor wirebonding.

Yet another aspect of the present invention is that it locates and measures bonded wires in out of focus images.

DETAILED DESCRIPTION OF THE INVENTION

Figure 1A:
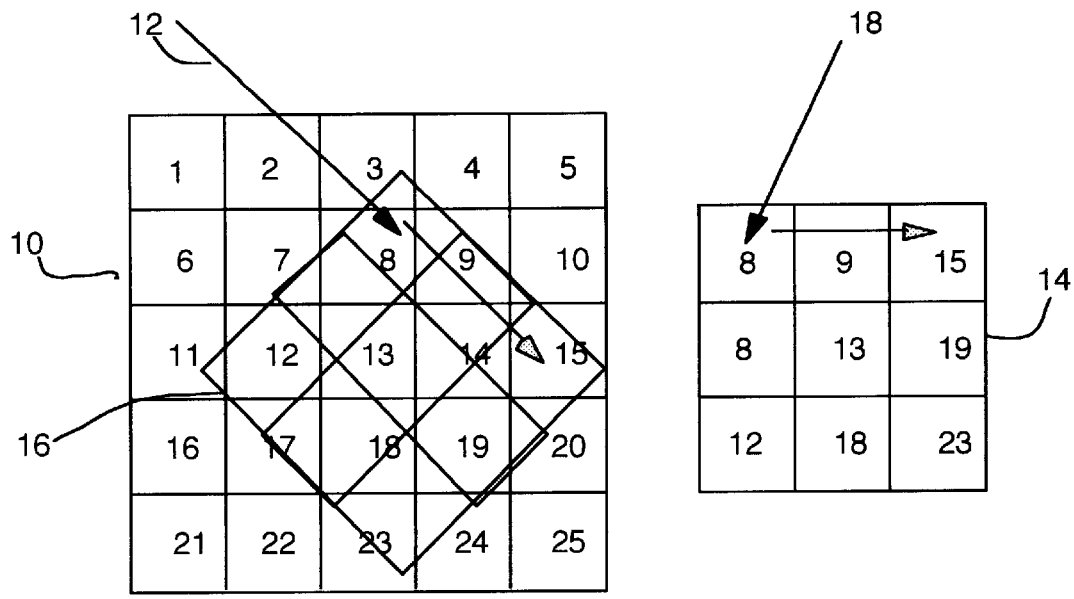
FIG. 1a is a block diagram of the alignment method and apparatus of the present invention.

In FIG. 1a, a preferred embodiment of the alignment interpolation of the present invention is shown. An image 10, containing pixels representing unaligned object 16 is shown. As can be seen in FIG. 1a, unaligned object 16 is not aligned with the image 10, but is displaced at an angle. Unaligned object 16 is aligned according to the method and apparatus of the present invention by first locating unaligned object 16 within the image 10, using conventional machine vision tools. A destination image 14 is created to contain the aligned image, having dimensions similar to those of the expected object. In FIG. 1a, the object is shown 3 pixels wide and 3 pixels long, although it will be apparent to those skilled in the art that objects of differing shapes and sizes can be aligned using the present invention.

According to the method and apparatus of the present invention, unaligned object 16 is viewed as having rows and columns, with a first whole pixel location 12 representing the start of a row. The invention locates a first whole pixel location 12 in unaligned object 16 corresponding to a first pixel location 18 in a first column in the destination image. Nest, the invention locates a first whole pixel location nearest to the first whole pixel location 12 in the unaligned image; copies the actual pixel value (here shown as 8) in unaligned object 16 to the first pixel location 18 in the destination image. The invention proceeds in this manner, moving, column by column along the angle of rotation in the window the height of a pixel to a second pixel area; locating a second whole pixel location; copying the actual pixel value of the second whole pixel location in unaligned object 16 to a second pixel location in the destination image, until all pixels in a first column of the unaligned image have been copied to the first row of the destination image; locating the next column, copying its pixels to the destination image; and continuing until a last column is located.

In a preferred embodiment, as a column is being aligned into the destination image, it is also projected into a one dimensional image, as interpolation proceeds on the next column. Upon completion, the image has been aligned and a projection created that permits normal caliper processing to continue.

Figure 1B:
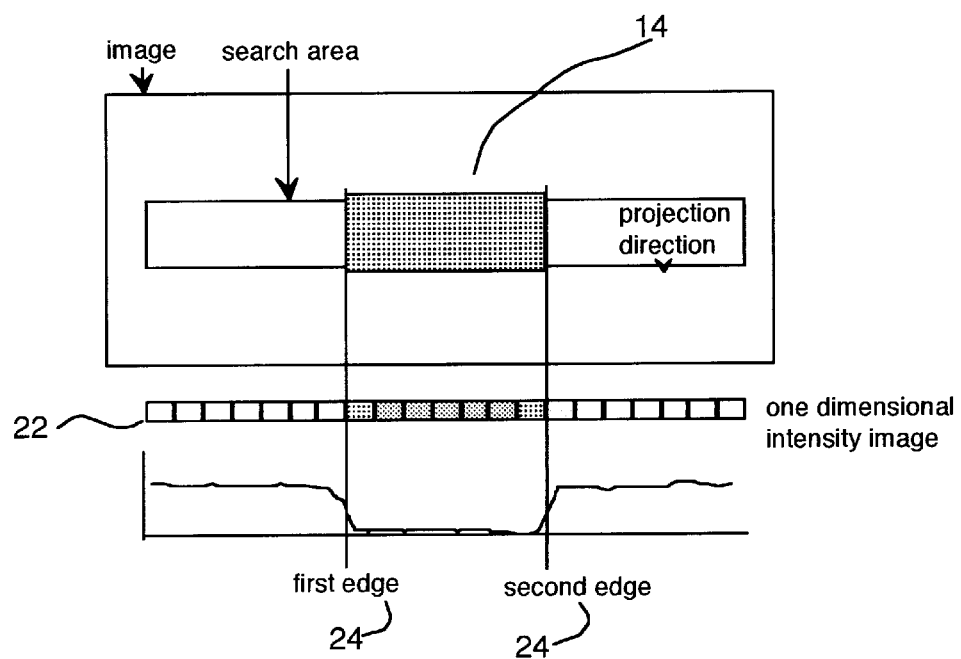
FIG. 1b is a schematic diagram of the application of caliper tool projection and edge filtering according to the method and apparatus of the present invention.

This is depicted in FIG. 1b, in which the aligned image 14, is projected into a one-dimensional image 22, to which an edge filter is applied, resulting in the edges detected at 24.

Figure 2A:
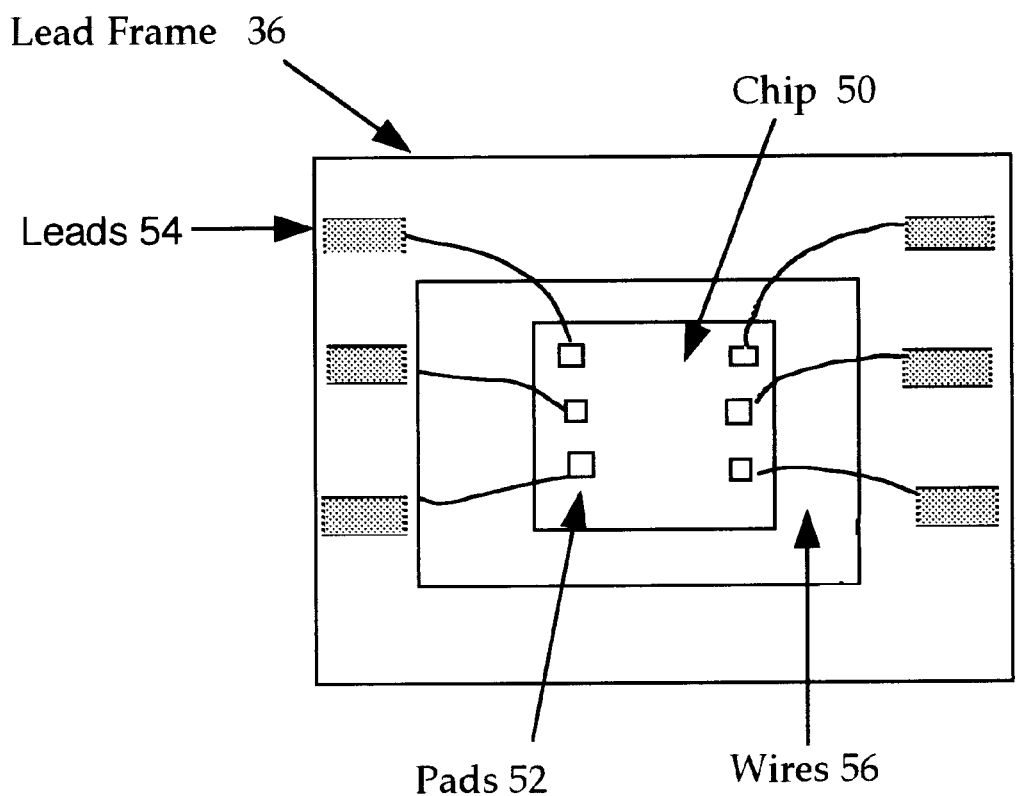
FIG. 2a is a top view of a semiconductor chip being bonded into a frame.
Figure 2B:
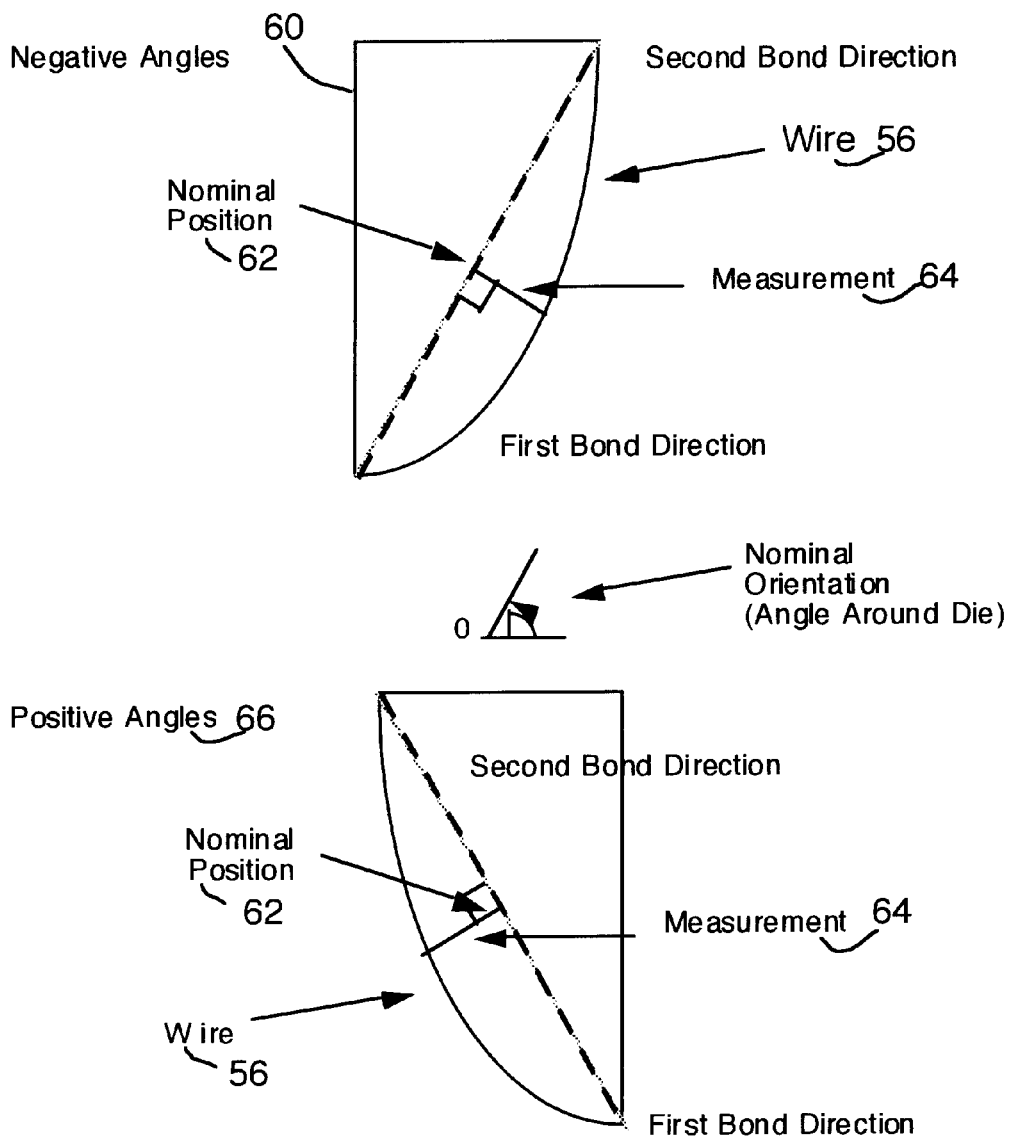
FIG. 2b is a schematic top view of two types of wires as they might appear in a wirebonding system.
Figure 2C:
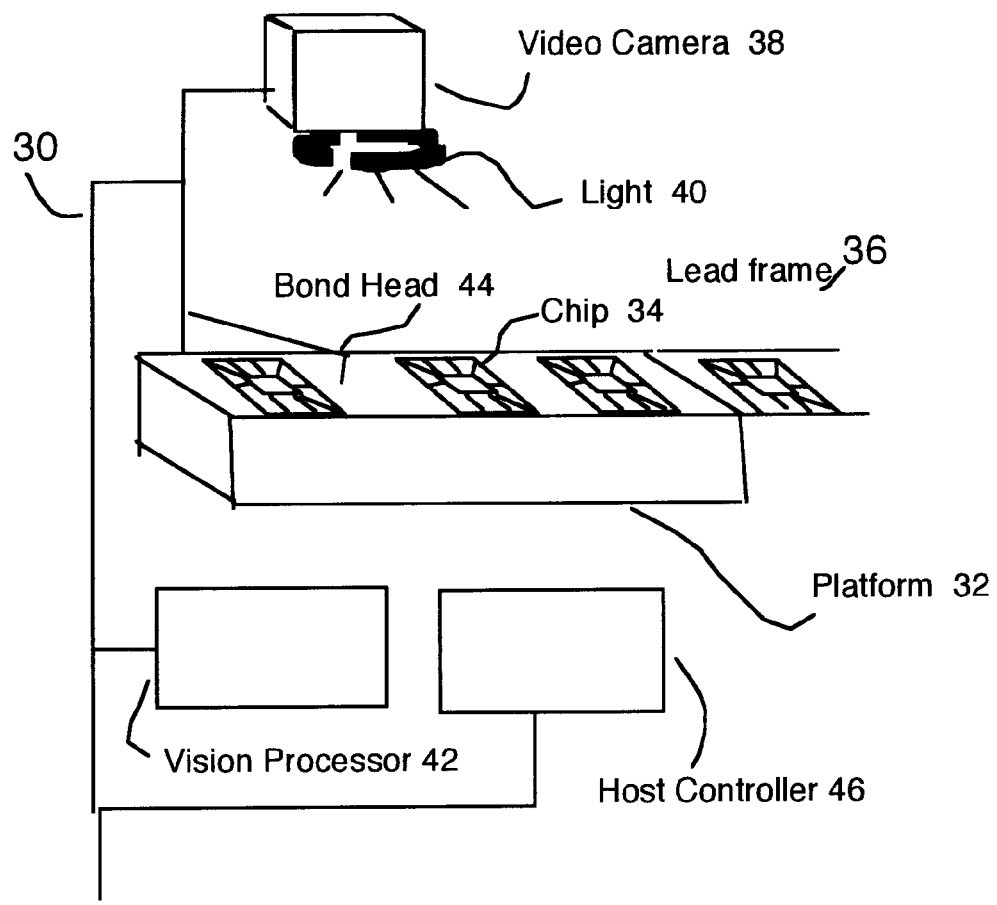
FIG. 2c is a perspective view of a wirebonding apparatus constructed according to the method and apparatus of the present invention.

In FIG. 2c, a system incorporating a preferred embodiment of the present invention is shown. The system includes a wire bonding machine 30 having a movable platform such as an X-Y table 32 for holding semiconductor chips 34 situated in a lead frame 36; a video camera 38 or other optical sensing device for generating images, which camera is typically positioned to view the lead frame 36 to be bonded; illumination means 40 for illuminating the chip in a lead frame; a vision processor 42, capable of digitizing and analyzing the optically sensed images; bonding mechanism 44; and host controller 46 electronically connected to the bonding mechanism 44, the movable platform 32, the camera 38 and the vision processor 42.

FIG. 2a depicts a semiconductor chip 50, in a lead frame 36, having pads 52, and leads 54. The wire bonding process bonds a conductive wire 56 between each pad on the chip 50 and its respective lead on lead frame 36. The wire 56 that bonds a pad 52 to a lead 54, would be ideally formed as a straight wire. However, for a variety of reasons, some displacement or curl is much more likely to occur.

Two examples of wire curl are shown in FIG. 2b. At negative angles 60, the nominal position 62 of wire 56 is shown as a straight line. This is where the wire should appear in an image if the bond were perfect. However, in this case, wire 56 is displaced away from the nominal position. The present invention determines how much displacement or curl has occurred by taking measurement 64, a measure of how much the wire deviates from nominal position 62. A similar situation is shown in FIG. 2b for positive angles 66.

In a preferred embodiment of the present invention, a nominal location and orientation of a wire 56, are found using Applicant's co-pending application, Automated Optical Inspection Apparatus, Ser. No. 08/132,532 and Automated Optical Inspection Apparatus, attorney docket number C93-038 Ser. No. 08/236,215 of which this is a continuation in part. These are hereby incorporated by reference. Alternatively, the nominal position of the wire could be considered to be the center of an acquired image, and only the nominal or expected orientation could be specified at runtime.

Figure 3A:
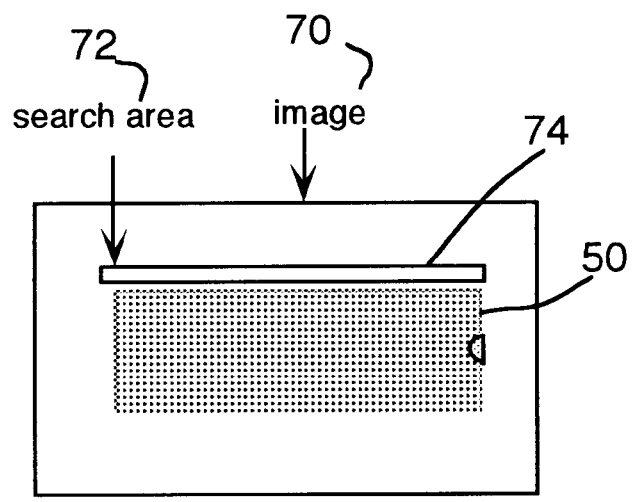
FIG. 3a is a schematic diagram of a machine vision caliper tool being applied to an image.
Figure 3B:
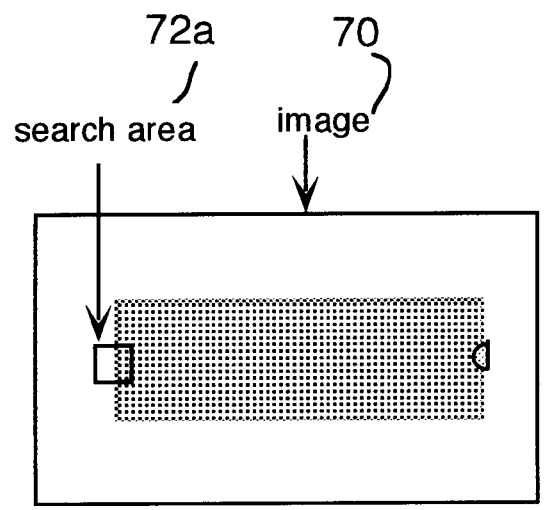
FIG. 3b is a schematic diagram of a search area used by a machine vision caliper tool.

In FIG. 3b, a digitized image of a semiconductor chip 50 in very close alignment to the camera is depicted. Chip 50, appears in this example as a darker area within image. A search area 72a is shown positioned across the leads on one side of chip 50. Since chip 50 is aligned with the visual system, a traditional caliper application can be used to gauge this part.

For example, in integrated circuit lead inspection, prior to bonding, a part is moved in front of a camera to an approximately known location (the expected location). Existing machine vision caliper tools can be used to determine the exact location of an edge of the part, such as the left edge of the part by searching for a single light to dark edge at the expected location. The edge that is closest to the expected location is the left edge of the part.

Once a feature of the part is located, a user can predict where the leads should lie within the image and thus specify a search area 72 or window in which to look for leads 74 as illustrated in FIG. 3a. Within this image an existing caliper machine vision tool can be used to search for edge pairs consisting of a dark to light transition followed by a light to dark transition, and separated by the expected lead width, permitting an inspection of the measured lead width and location to expected lead width and location to make an accept/reject decision about the part.

As is known to those skilled in the art, existing caliper tools can use projection to map a two dimensional window of an image, in the example of FIG. 3, search area 72, into a one dimensional image. Projection collapses an image by summing the pixels in the direction of the projection, which tends to amplify edges in that direction.

Figure 4:
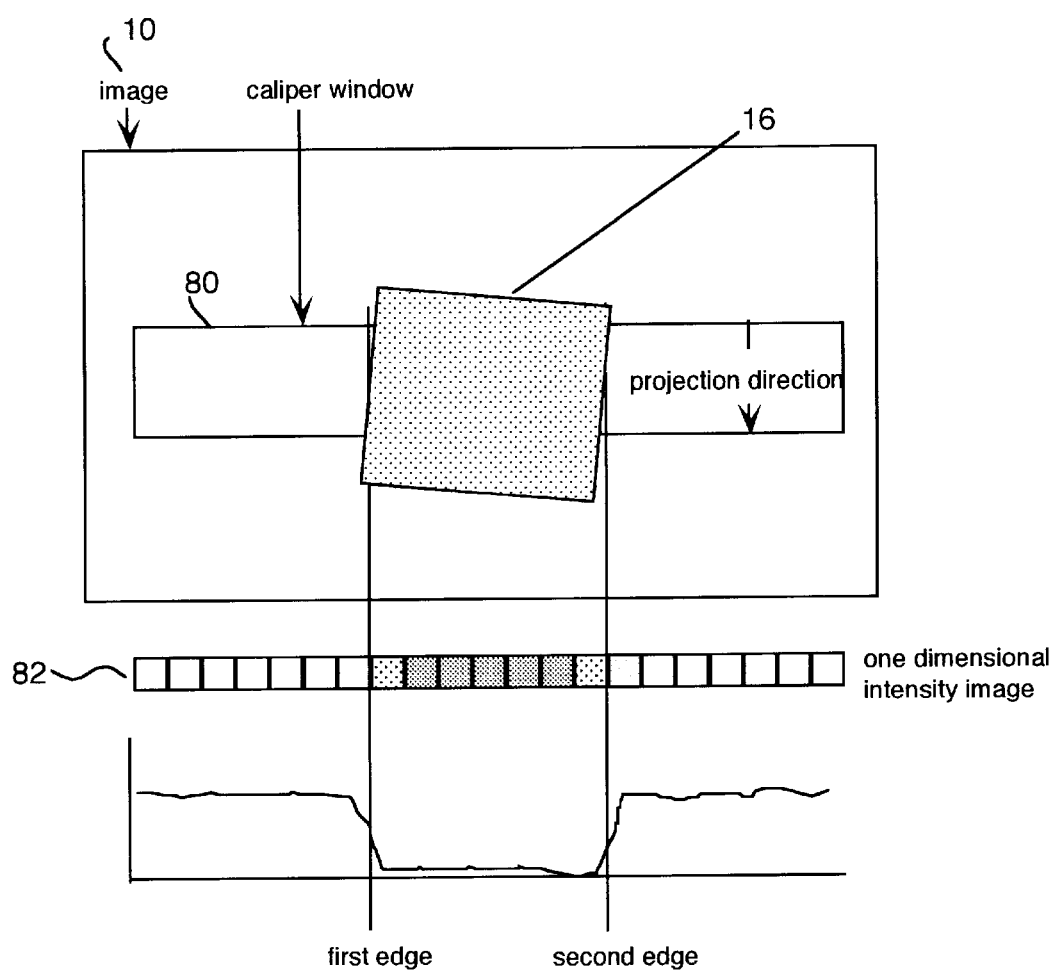
FIG. 4 illustrates the direction of a projection in a search window, the resultant intensity image, and a plot of that projection in graph form as performed by existing caliper like tools.

FIG. 4 shows an unaligned object 16, a caliper window 80, the one dimensional intensity image 82 that results from projection, and a graph of the pixel grey values in the one dimensional intensity image 82.

Figure 5:
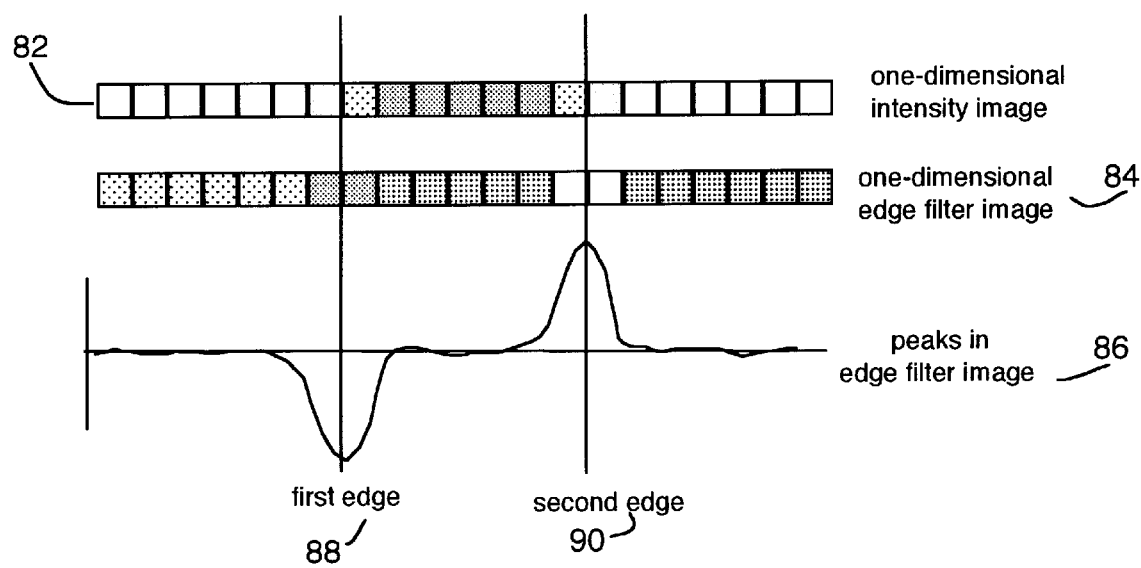
FIG. 5 illustrates application of a one-dimensional edge filter image to a projection, and a plot of the resulting first derivative image in graph form, again according to existing caliper-like tools.

In FIG. 5, it can be seen that after projection, an edge filter 84, is applied to one dimensional image 82 to further enhance edge information and to smooth the image by eliminating minor grey value changes between neighboring pixels that are most likely caused by noise. The edge filter produces a first derivative image (the most rapid changes in grey value in the projected image result in the highest peaks in the filtered image).

FIG. 5 shows the one dimensional edge filter image 84 created by the projection, and a graph 86 of that image, in which the peaks detected are taken to be the first edge 88 and the second edge 90 of unaligned object 16.

Figure 5A:
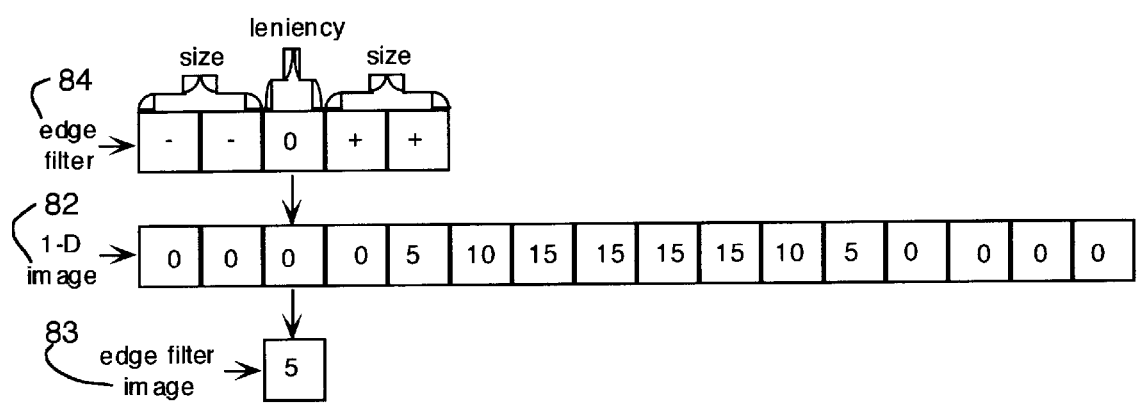
FIG. 5a illustrates a typical one-dimensional edge filter used in existing caliper tools.

Turning to FIG. 5a, still in existing caliper tools, edge filter 84 is applied to the one-dimensional image that results from projection. After the filter operation, any of a number of methods of edge detection can be performed on the filtered image. As is known to those skilled in the art, edge detection is a method of evaluating peaks in the filtered image and ignoring edges that are not of interest, such as edges representing noise in the image. A typical edge detection technique applies geometric constraints specified by a user to each edge or edge pair found in the image.

Applying geometric constraints provides a way to limit the number of edges to evaluate by assigning a score to each edge or edge pair based on such factors as the expected location of the edge or edge pair, the distance between edges in an edge pair, and the minimum grey level difference between pixels on each side of the edge.

As will be apparent to those skilled in the art, the two parameters of an edge filter 84 are its size and leniency. Edge filter size is the number of pixels to each side of the edge to consider in the evaluation. Edge filter leniency is the number of pixels at an edge to ignore between light and dark sides of the edge. In FIG. 5a, edge filter 84 is positioned over the leftmost pixel in the one dimensional image 82 where it will entirely fit in that image. Pixel values to the left of the leniency region are summed and subtracted from the sum of the pixel values to the right of the leniency region: in this example, (0+5)–(0+0) yields 5 for the edge filter image 83.

Edge filter 84 is then applied at each successive pixel in the one-dimensional image until the edge filter no longer fits entirely in the image. At each pixel position, the pixel values to the left of the leniency region are summed and subtracted from the sum of the pixel values to the right of the leniency region and the result is written to the edge filter image.

The controlling variables of an edge or edge pair search define a caliper in existing applications, and include such information as the dimensions of the search area and the edge detection scoring parameters.

Figure 6:
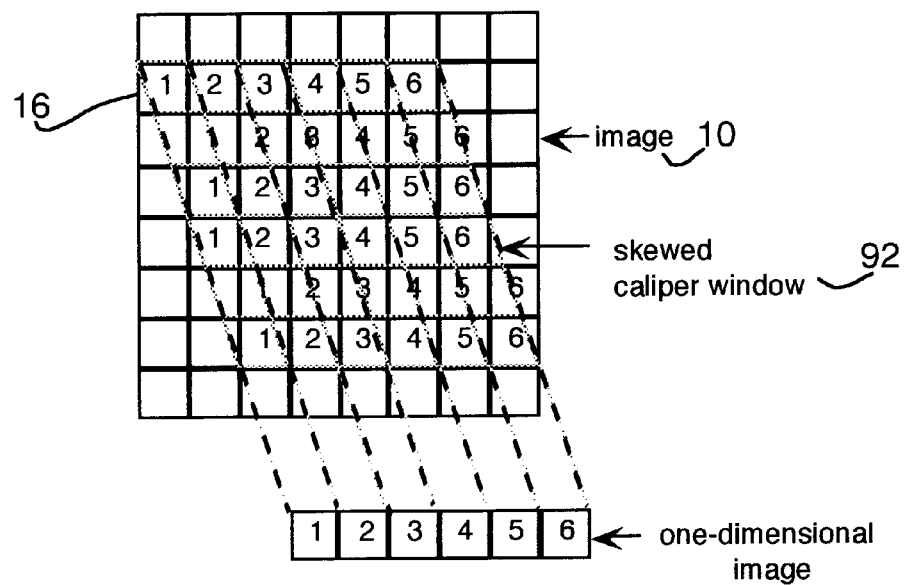
FIG. 6 shows results created by existing caliper tools using skewed calipers.

FIG. 6 depicts the results of using known techniques to apply caliper tools to a rotated image. FIG. 6 has applied a 15° caliper search area to an image 10 of an unaligned object 16 that has not been additionally rotated to align it with a 90 degree angle. In this case existing tools create a "skewed" window 92 and project it along the angle of skew into a one-dimensional image. As will be apparent to those skilled in the art, this technique is sometimes referred to as using skewed calipers.

In existing systems, a user can specify how the skewed caliper is to be applied—with or without known interpolation techniques. Existing methods of interpolation increase accuracy at the expense of execution speed. If a skewed search area is used without interpolation for projection, accuracy may suffer.

The present invention locates nonaligned objects, also called oriented objects in an image without the use of linear interpolation or skewed caliper techniques and that interpolation.

Returning now to FIG. 1, an unaligned object 16 is shown schematically, as the inner square, located at an angle within image 10. As with existing methods, the system first obtains a nominal location of unaligned object 16 within image 10. A search area is specified within image 10 for locating unaligned object 16. An angle of rotation of the search area is specified. Destination image 14 is also created, having the same dimensions as expected unaligned object 16, but having no angle of rotation. That is, the destination image 14 is perfectly aligned with a 90 degree angle.

According to the method and apparatus of the present invention, a nearest neighbor interpolation copies unaligned object 16, in image 10, into destination image 14.

Still in FIG. 1a it can be seem that this is accomplished by moving column by column in unaligned object 16 to locate a first whole pixel location 12 in image 10, corresponding to a first pixel location 18 in a first column in destination image 14.

In the illustration in FIG. 1a, the first whole pixel location, is schematically represented as "covering" portions of four pixel areas adjacent to each other. The present invention locates the first whole pixel location nearest to the first pixel area in the unaligned object 16. In FIG. 1a, this pixel area contains the grey value 8. The actual pixel value of this first whole pixel location is copied to the first pixel location 18 in the destination image 14. In FIG. 1a it can be seen that the value 8 appears in the upper left hand corner of destination image 14.

In a preferred embodiment, the present invention moves column by column along the angle of rotation of unaligned object, in image 10, the width of a pixel to a second pixel area. There it locates a second whole pixel location, copies the actual pixel value of the second whole pixel location to a second pixel location in the destination image 14, until all pixels in a first column of unaligned object 16 have been copied to the first column of the destination image 14. Since the nominal location and dimensions, in x,y coordinates, of unaligned object 16 are supplied to the present invention, it uses these to compute and locate the next column, copying its pixels to the destination image and continuing until a last column is located.

As will be apparent to those skilled in the art, the present invention can be applied to move row by row, in the search area or window, rather than column by column.

A preferred embodiment of the present invention uses the column by column method in order to create the projection image simultaneously, using Applicant's Assignee's U.S. Pat. No. 4,972,359 Digital Image Processing System, "VC1", which is hereby incorporated by reference. Using systems constructed in accordance with the VC1, the summing operation that creates the one dimensional projection is done automatically as each pixel in the search area in a column is accessed. This significantly contributes to speed for the most time critical applications.

According to the method and apparatus of the present invention, upon completion of the copying of the pixels, destination image 14 has been, in effect, rotated into alignment while projection has taken place at the same time, in a preferred embodiment. It will be apparent to those skilled in the art that the present invention can be applied in two separate operations, such as the rotation followed by a projection step.

In either of these embodiments, the image has been aligned and a projection created that permits normal caliper processing to continue.

In a preferred embodiment, the method and apparatus of the present invention includes a method and apparatus for locating and inspecting bonded wires in a semiconductor wirebonding application, such as that depicted in FIG. 2c.

Returning to FIG. 2b, it can be seen that bonded wires 56, on chip 50, may be placed at a number of different angles about chip 50. Ideally, wires 56 would appear as straight lines, nominal positions 62, to the imaging system, if the bonding mechanism created perfectly aligned bonds. In practice, however, that does not occur, so it can be seen that wires 56, are more likely to appear to the imaging system as curved lines shown here.

Still in FIG. 2b, some typical deviations of the bonds from ideal straight lines are shown—one for negative angles 60 and one for positive angles 66. In both examples, nominal position 62, is an imaginary line which represents the ideal or expected location of a perfectly bonded wire. Wire 56, illustrates the type of curvature that is likely to occur. In this figure, the terms first bond direction 57 and second bond 59 direction refer to the attachment of the wire in the direction of the pad and the lead, respectively.

According to the method and apparatus of the present invention, a nominal width of wire 56 is specified a by the user and a nominal orientation of the wire and its nominal position are located at runtime using applicant's co-pending Automated Optical Inspection Apparatus, Ser. No. 08/236, 215 of which this is a continuation in part. Alternatively, the nominal position of the wire could always be the center of the acquired image and only a nominal orientation could be specified at runtime.

Figure 7:
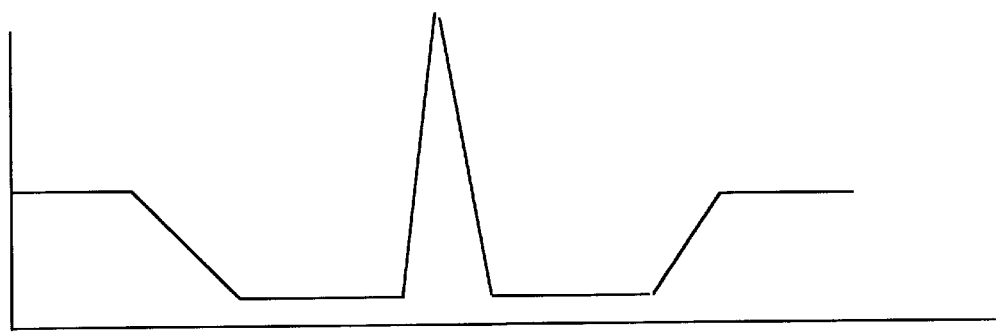
FIG. 7 is a plot of a one-dimensional projection of a rotated wire containing specular reflections.

The present invention applies a projection at the location in the image of the nominal or expected wire angle. This results in a one-dimensional projection signal, depicted in FIG. 7. A one dimensional edge filter 84 is applied to create a first derivative which is illustrated by the plot in FIG. 8.

Figure 8:
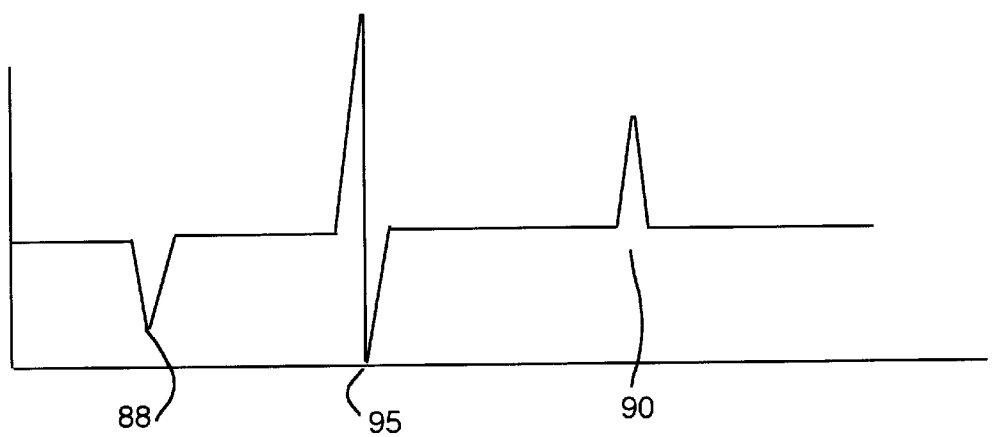
FIG. 8 is a plot of a first derivative created by application of an edge filter to the plot in FIG. 7.

The present invention analyzes the first derivative signal to find a characteristic projection signature of the wire. In FIG. 8, such a signature is shown as one having first edge 88, of the correct, expected polarity, separated by an appropriate distance from a second edge 90 having a different correct polarity. In the example in FIG. 8, a specular reflection 95, is depicted within the first derivative signal as well.

Analysis of the first derivative shown in FIG. 8 is accomplished by looking for maxima and minima, or "peaks and valleys" in the signal. FIG. 12 contains illustrative code, written in the C computer language to accomplish this in a preferred embodiment. As will be apparent to those skilled in the art, a number of different techniques can be used to analyze the projection signal for the characteristic features. For example, if a particular signature is not found, a different edge filter or edge operator could be applied to the projection signal, to create a different first derivative, or the same edge filter could be applied to the first derivative to create a second derivative, which is then analyzed by looking for zero crossings.

In a preferred embodiment, edge filter 84, is a two pixel wide filter, is applied to the projection signal only once and contains no leniency pixels.

The absence of leniency pixels in edge filter 84 tends to increase accuracy, over edge filters applied for this application having one or more leniency pixels.

Figure 10:
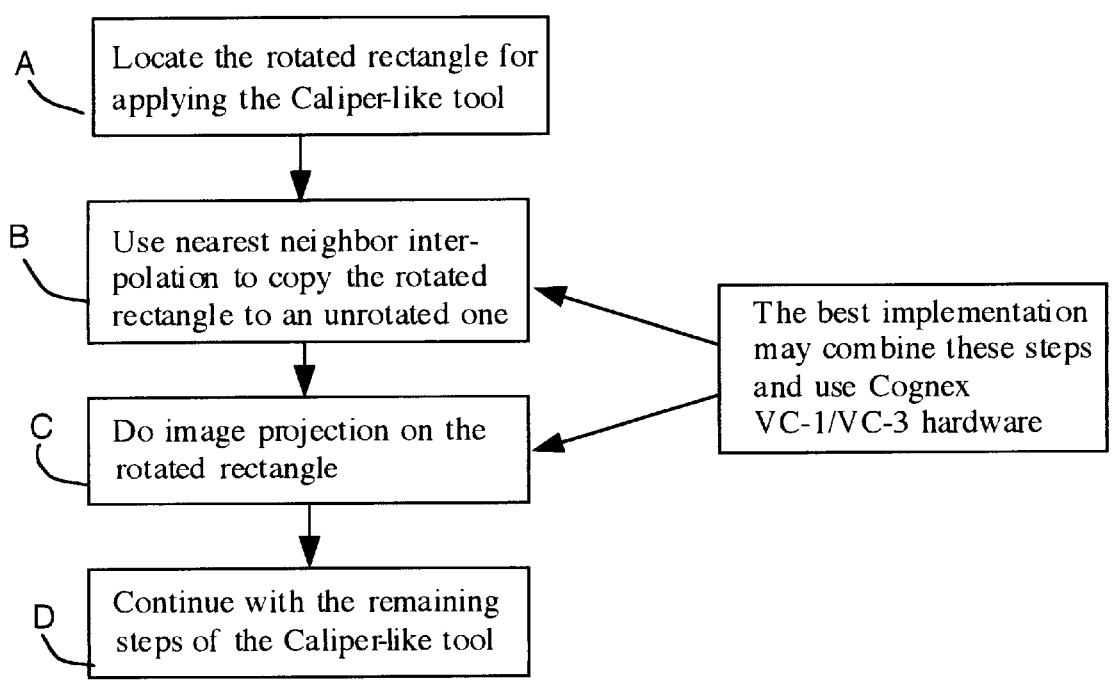
FIG. 10 contains a flow diagram of the present invention.

Turning now to FIG. 10, a flow diagram illustrating the present invention in a wirebonding application is presented, as it is embodied in a wire finding portion of an inspection. At Step A, the unaligned object 16 is located in an image 10.

Next, in Step B unaligned object 16 is rotated, as described above. In a preferred embodiment, a one-dimensional projection image is created at Step C, while unaligned object 16 is being aligned. Alternatively, a separate projection Step C could be performed.

At Step D, the remaining steps of use of the caliper tool are carried out. In a preferred embodiment, this includes applying edge filter or operator to the projection signal to create a first derivative, analyzing the first derivative as described in FIG. 8, by looking for maxima and minima representative of a characteristic wire signature. If no wire signature is found, the invention proceeds to analyze the first derivative for a characteristic wire specularity signature. It will be apparent to those skilled in the art that these two steps could be carried out in one analysis step or two. If a wire signature is likely to be found, it may save time to use two operations, and bypass the analysis for the specularity signature. In many applications, a wire signature may not be easy to find, and thus combining the two steps or operations is more productive. In a preferred embodiment, if either signature is found, a preferred embodiment of the present invention looks for all other similar signatures in the projection signal, but does not look for the other type of signature. For example, if a wire signature is found, the signal will continue to be analyzed to look for similar wire signatures, but no analysis will be done to look for wire specularity signatures.

If no signature of either type was found, a preferred embodiment of the present invention returns a not found signal for wire presence.

Figure 9:
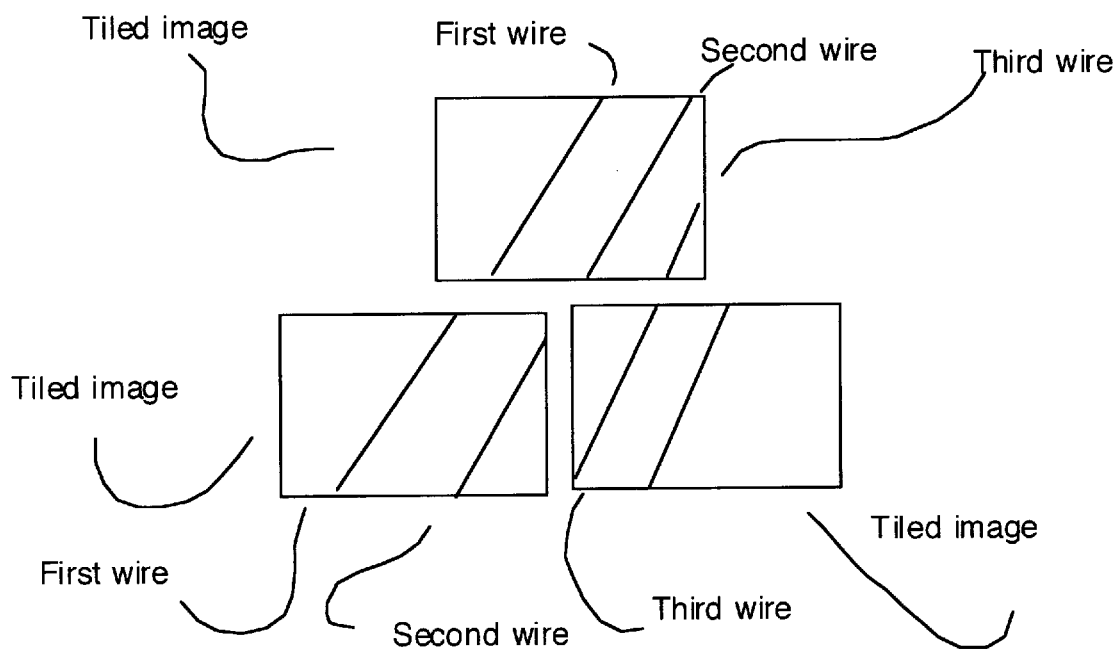
FIG. 9 illustrates tiled images, each containing a portion of a wire.

If one or more signatures was found, one is selected as the found wire based on one or more of the following criteria:

darkness or intensity of the wire. In many applications, the wire is typically the darkest object in the scene because it is a highly specular surface and will only reflect light back to the camera if the light source or illumination means is from a particular angle with respect to the wire and the camera.

highest contrast wire. Often shadows of wires are also in the scene. A shadow of a wire has lower contrast than the wire itself.

wire on a particular side of a search area. Some wire bonding mechanisms place wires that are either concave or convex. This can be used to help differentiate between closely spaced wires.

wire is a continuation of a previously found wire. Depending on the camera's field of view, the magnification of the image, and the type of part being inspected, several wires can be included in an image. In some cases, two or three images of bonds on a chip can be tiled as illustrated in FIG. 9. In either situation if an image contains several wires, simple geometry can be used to ascertain whether one wire is a continuation of another.

If a wire has been found, its location is subtracted from the location of the ideal straight line wire or nominal location in a direction perpendicular to the direction of the ideal straight wire. The difference value thus created is returned to a next module as the wire curl measurement. For in process inspections, the next module may be decision module that uses the signals to determine whether all wires that should be present are present, and whether the wire curl is within predetermined limits that indicate the likely formation of a good connection. The absence of wires or significant deviations from acceptable wire curl measurements may be signalled to a host controller for further action, such as rejection of the part, adjustment of the bonder, and so on.

Those skilled in the art will appreciate that the embodiments described above are illustrative only, and that other systems in the spirit of the teachings herein fall within the scope of the invention. A preferred embodiment of the present invention also includes a camera or other device for generating a video or image signal. The video signal generated by the camera is typically converted from analog to digital by techniques well known in the art and sent to an image memory, such as a frame grabber, or similar device for storing images. A vision processor system, which includes a computer central processing chip, and input/output capabilities, is coupled to the image memory and is used to perform image processing and analysis according to the present invention. Portions of image processing and analysis are accomplished by software programs controlling the vision processor system, or, as will be evident to one skilled in the art, can be controlled by equivalent circuits created in special integrated circuit chips. The results of image processing and analysis are transmitted electronically to the apparatus or system requiring the machine vision results. Alternatively, the machine vision function can be incorporated within and work as part of a larger system.

What is claimed is:

1. A method for analyzing an image of at least one wire having an angle relative to at least one axis of an image coordinate system, the method comprising:

specifying dimensions of a destination image aligned with the image coordinate system;

copying selected pixels of said wire to the destination image using nearest neighbor interpolation so as to produce a destination image having said wire generally normal to at least one axis of the image coordinate system;

projecting said wire within the destination image along a length of said wire to generate a one-dimensional image;

processing the one-dimensional image to enhance rate changes within the one-dimensional image so as to produce a one-dimensional signature representative of said wire within the image; and comparing the one-dimensional signature to a wire signature and a wire specularity signature to determine wire presence.

2. The method of claim 1, for gauging an image of a wire, further comprising:

identifying possible wire positions in the one-dimensional signature after determining wire presence; and gauging at least one dimension of a wire represented by the at least one of the possible wire positions.

3. The method of claim 2, further comprising:

providing at least one constraint representative of a wire; and ranking the possible wire positions using at least one constraint to identify said wire.

4. The method of claim 3, wherein the at least one constraint includes direction of a bend of said wire.

5. The method of claim 3, wherein the at least one constraint is that said wire is a continuation of a wire from a contiguous one-dimensional image.

6. The method of claim 3, wherein the at least one constraint is that said wire is a highest contrast object within the one-dimensional image.

7. The method of claim 3, wherein the at least one constraint is that said wire is a darkest object within the one-dimensional image.

8. The method of claim 2, wherein gauging includes measuring wire curl.

9. The method of claim 2, wherein identifying possible wire positions in the one-dimensional signature after determining wire presence includes:

identifying a wire position associated with at least one maxima and at least one minima within the one-dimensional signature that matched at least one positive and negative peak.

10. The method of claim 1, wherein comparing the one-dimensional signature to a wire signature and a wire specularity signature to determine wire presence includes:

comparing at least one maxima and at least one minima within the one-dimensional signature to positive and negative peaks of a wire signature and a wire specularity signature to determine wire presence.

11. The method of claim 1, wherein copying selected pixels of said wire to the destination image and projecting said wire within the destination image are completed substantially simultaneously so as to minimize storage of the destination image.

12. The method of claim 1, wherein processing the one-dimensional image includes:

smoothing the one-dimensional image to minimize the effect of noise within the one-dimensional image; and applying an edge filter to create a first derivative of the one-dimensional image, the first derivative being the one-dimensional signature.

13. The method of claim 12, wherein the edge filter has a size of two pixels representative of the number of pixels to each side to consider in an edge, and has a zero-pixel leniency representing the number of pixels to ignore at an edge between light and dark sides of the edge.

14. The method of claim 1, where comparing the one-dimensional signature to a wire signature and a wire specularity signature to determine wire presence includes:

comparing the one-dimensional signature to a wire signature and a wire specularity signature until one possible wire position is located, where the possible wire position corresponds to a found-wire characteristic; and comparing thereafter the one-dimensional signature to the found-wire characteristic to determine wire presence.

15. The method of claim 14, wherein the found-wire characteristic is the wire signature.

16. The method of claim 14, wherein the found-wire characteristic is the specularity signature.

* * * * *